United States Patent
Lee et al.

(10) Patent No.: US 8,018,764 B2
(45) Date of Patent: Sep. 13, 2011

(54) MAGNETIC TRACKS, INFORMATION STORAGE DEVICES INCLUDING MAGNETIC TRACKS, AND METHODS OF OPERATING INFORMATION STORAGE DEVICES

(75) Inventors: Sung-chul Lee, Osan-si (KR); Jai-kwang Shin, Anyang-si (KR); Sun-ae Seo, Hwaseong-si (KR); Young-jin Cho, Suwon-si (KR); Ung-hwan Pi, Seoul (KR); Ji-young Bae, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 12/461,062

(22) Filed: Jul. 30, 2009

(65) Prior Publication Data

US 2010/0149863 A1    Jun. 17, 2010

(30) Foreign Application Priority Data

Dec. 15, 2008 (KR) .......................... 10-2008-0127266

(51) Int. Cl.
*G11C 11/14* (2006.01)
(52) U.S. Cl. .......................... 365/171; 365/80
(58) Field of Classification Search .................. 365/171, 365/80
See application file for complete search history.

(56) References Cited

U.S. PATENT DOCUMENTS

| | | | |
|---|---|---|---|
| 2007/0242505 A1* | 10/2007 | Ochiai et al. | 365/171 |
| 2008/0080234 A1* | 4/2008 | Iwata et al. | 365/171 |
| 2008/0138659 A1* | 6/2008 | Lim et al. | 428/810 |
| 2008/0165576 A1 | 7/2008 | Deligianni et al. | |
| 2010/0172169 A1* | 7/2010 | Lee et al. | 365/80 |

FOREIGN PATENT DOCUMENTS

| | | |
|---|---|---|
| JP | 2007-324269 | 12/2007 |
| JP | 2008-090957 | 4/2008 |
| KR | 10-0718153 | 5/2007 |
| KR | 10-2007-0084884 | 8/2007 |

* cited by examiner

*Primary Examiner* — Connie C Yoha
(74) *Attorney, Agent, or Firm* — Harness, Dickey & Pierce, P.L.C.

(57) ABSTRACT

A magnetic track includes first and second magnetic domain regions having different lengths and different magnetic domain wall movement speeds. A longer of the first and second magnetic domain regions serves as an information read/write region. An information storage device includes a magnetic track. The magnetic track includes a plurality of magnetic domain regions and a magnetic domain wall region formed between neighboring magnetic domain regions. The plurality of magnetic domain regions includes a first magnetic domain region and at least one second magnetic domain region having a smaller length than the first magnetic domain region. The information storage device further includes a first unit configured to perform at least one of an information recording operation and an information reproducing operation on the first magnetic domain region, and a magnetic domain wall movement unit configured to move a magnetic domain wall of the magnetic domain wall region.

25 Claims, 5 Drawing Sheets

MAGNETIC TRACKS, INFORMATION STORAGE DEVICES INCLUDING MAGNETIC TRACKS, AND METHODS OF OPERATING INFORMATION STORAGE DEVICES

CROSS-REFERENCE TO RELATED APPLICATION(S)

This application claims priority under 35 U.S.C. §119 to Korean Patent Application No. 10-2008-0127266, filed on Dec. 15, 2008, in the Korean Intellectual Property Office, the disclosure of which is incorporated herein in its entirety by reference.

BACKGROUND

1. Field

One or more example embodiments relate to magnetic tracks, information storage devices including magnetic tracks, and methods of operating information storage devices.

2. Description of the Related Art

Non-volatile information storage devices retain recorded information even when power is cut off. Examples of conventional non-volatile information storage devices include hard disk drives (HDDs), non-volatile random access memories (RAMs), etc.

In general, an HDD may wear down due to a rotating mechanical device included in the HDD. As a result, HDDs may experience operational failures, thereby reducing reliability. Meanwhile, a representative example of a conventional non-volatile RAM is flash memory. Although conventional flash memories do not use a rotating mechanical device, these memories have relatively low reading and writing speeds, relatively short lifetimes, and smaller storage capacity than conventional HDDs. Also, conventional flash memories have relatively high manufacturing costs.

Another non-volatile memory uses movement of a magnetic domain wall of a magnetic material. A magnetic domain is a minute magnetic region in which magnetic moments are arranged in a specific direction in a ferromagnetic material. A magnetic domain wall is a border region between magnetic domains having different magnetization directions. The magnetic domain and the magnetic domain wall may be moved by supplying a current to the magnetic material. An information storage device, which has a relatively large storage capacity and does not use a rotating mechanical device, may be realized by using the movement of the magnetic domain and the magnetic domain wall.

Although a magnetic domain may have a relatively small size, (e.g., a length of about 10 nm) conventional read and write units do not have similarly small sizes due to, for example, limitations on lithographic processes. Currently, a line width of the read unit or the write unit may be reduced to between about 50 and about 60 nm, inclusive. Therefore, if a size of a magnetic domain is determined according to the size of the read unit (or the write unit), the magnetic domain cannot be shorter than between about 50 and about 60 nm, inclusive. As a result, increasing recording density is relatively difficult.

SUMMARY

One or more example embodiments provide a magnetic track having a plurality of magnetic domain regions and a magnetic domain wall region between the magnetic domain regions.

One or more example embodiments provide an information storage device using movement of a magnetic domain and a magnetic domain wall.

One or more example embodiments provide a method of operating the information storage device.

According to at least one example embodiment a magnetic track includes a first magnetic domain region and at least one second magnetic domain region. The at least one second magnetic domain region may have a different length from the first magnetic domain region. A magnetic domain wall movement speed in the first magnetic domain region may be different from the magnetic domain wall movement speed in the second magnetic domain region.

According to at least some example embodiments, a length of the first magnetic domain region may be greater than the length of the second magnetic domain region. In addition, or alternatively, the magnetic domain wall movement speed in the first magnetic domain region may be greater than the magnetic domain wall movement speed in the second magnetic domain region.

According to at least some example embodiments, the magnetic domain wall movement speed in the first magnetic domain region may be proportional to the magnetic domain wall movement speed in the second magnetic domain region; for example, $V1=(l1/l2)\times V2$ may be satisfied. In this equation, $l1$ is a length of the first magnetic domain region, $l2$ is the length of the second magnetic domain region, $V1$ is the magnetic domain wall movement speed in the first magnetic domain region, and $V2$ is the magnetic domain wall movement speed in the second magnetic domain region.

According to at least some example embodiments, properties of the first magnetic domain region may be different from the properties of the second magnetic domain region. For example, at least one of a spin polarization, a saturation magnetization, and a magnetic anisotropy energy constant of the first magnetic domain region may be different from that of the second magnetic domain region.

According to at least some example embodiments, one of the first and second magnetic domain regions may have a faster magnetic domain wall movement speed than the other. The spin polarization of the faster of the first and second magnetic domain regions may be greater than the spin polarization of the other. Alternatively, or in addition, the saturation magnetization of the faster of the first and second magnetic domain regions may be smaller than the saturation magnetization of the other. The width the magnetic domain region having the faster magnetic domain wall movement speed may be smaller than the width of the other. The thickness of the magnetic domain region having the faster magnetic domain wall movement speed may be smaller than the thickness of the other of the magnetic domain regions.

According to at least some example embodiments, a width and/or a thickness of the first magnetic domain region may be different from a width and a thickness of the second magnetic domain region.

According to at least some example embodiments, a plurality of second magnetic domain regions may be connected in series to at least one of both ends of the first magnetic domain region.

One or more example embodiments provide a magnetic track including a first magnetic domain region and at least one second magnetic domain region. The at least one second magnetic domain region may have a length smaller than the length of the first magnetic domain region. The first magnetic domain region may serve as an information read/write region.

A magnetic domain wall movement speed in the first magnetic domain region may be greater than the magnetic domain wall movement speed in the second magnetic domain region. In one example, the magnetic domain wall movement speed in the first magnetic domain region may be proportional to the magnetic domain wall movement speed in the second magnetic domain region; for example, $V1=(l1/l2) \times V2$ may be satisfied. In this case, l1 is a length of the first magnetic domain region, l2 is the length of the second magnetic domain region, V1 is the magnetic domain wall movement speed in the first magnetic domain region, and V2 is the magnetic domain wall movement speed in the second magnetic domain region.

One or more example embodiments provide an information storage device including a magnetic track. According to at least one example embodiment, the magnetic track includes a plurality of magnetic domain regions and a magnetic domain wall region formed between each pair of neighboring magnetic domain regions. The plurality of magnetic domain regions include a first magnetic domain region and at least one second magnetic domain region. The at least one second magnetic domain region may have a smaller length than the first magnetic domain region. The information storage device may further include a first unit and a magnetic domain wall movement unit. The first unit may perform at least one of an information recording operation and an information reproducing operation on the first magnetic domain region. The first unit may be a tunnel magneto-resistance (TMR) device or a giant magneto-resistance (GMR) device. The magnetic domain wall movement unit may move a magnetic domain wall of the magnetic domain wall region.

According to at least some example embodiments, a magnetic domain wall movement speed in the first magnetic domain region may be greater than the magnetic domain wall movement speed in the second magnetic domain region. The magnetic domain wall movement speed in the first magnetic domain region may be proportional to the magnetic domain wall movement speed in the second magnetic domain region; for example, $V1=(l1/l2) \times V2$ may be satisfied. In this case, l1 is a length of the first magnetic domain region, l2 is the length of the second magnetic domain region, V1 is the magnetic domain wall movement speed in the first magnetic domain region, and V2 is the magnetic domain wall movement speed in the second magnetic domain region.

Properties of the first magnetic domain region may be different from the properties of the second magnetic domain region. For example, at least one of a spin polarization, a saturation magnetization, and a magnetic anisotropy energy constant of the first magnetic domain region may be different from that of the second magnetic domain region. The spin polarization of the first magnetic domain region may be greater than the spin polarization of the second magnetic domain region and/or the saturation magnetization of the first magnetic domain region may be smaller than the saturation magnetization of the second magnetic domain region.

According to at least some example embodiments, at least one of a width and a thickness of the first magnetic domain region may be different from that of the second magnetic domain region. For example, the width of the first magnetic domain region may be smaller than the width of the second magnetic domain region. Alternatively, or in addition, the thickness of the first magnetic domain region may be smaller than the thickness of the second magnetic domain region.

A plurality of second magnetic domain regions may be connected in series to at least one of both ends of the first magnetic domain region.

BRIEF DESCRIPTION OF THE DRAWINGS

The general inventive concept will become apparent and more readily appreciated from the following description of example embodiments, taken in conjunction with the accompanying drawings of which.

DETAILED DESCRIPTION

Figure 1:
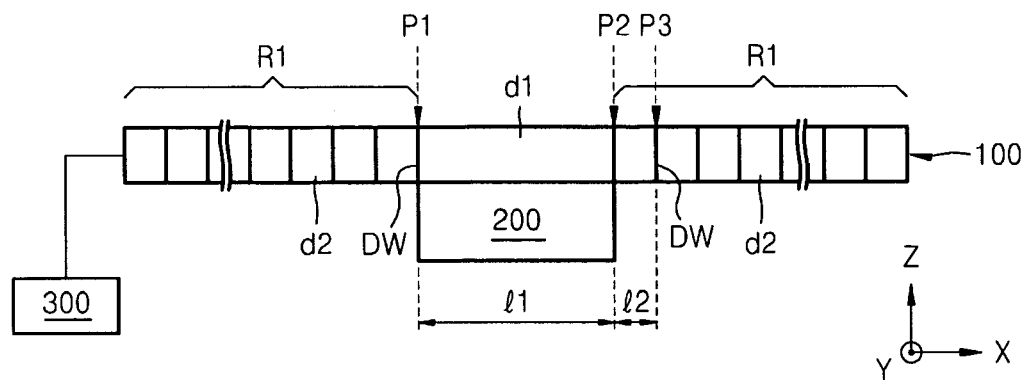
FIG. 1 is a cross-sectional view of an information storage device including the magnetic track according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. The general inventive concept may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the general inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 is a cross-sectional view of an information storage device including a magnetic track according to an example embodiment.

Referring to FIG. 1, a magnetic track 100 extends in a given, desired or predetermined direction (e.g., the X-axis direction). The magnetic track 100 is an information storage layer formed of a ferromagnetic material. For example, the magnetic track 100 may include at least one of Co, Ni, Fe, a combination thereof or the like, in addition to other materials. According to at least this example embodiment, the magnetic track 100 includes a first magnetic domain region d1 and at least one second magnetic domain region d2. The first magnetic domain region d1 and the second magnetic domain region d2 may have different lengths. For example, a length l1 of the first magnetic domain region d1 may be greater than a length l2 of the second magnetic domain region d2. The first magnetic domain region d1 may serve as a read/write region of the information storage device.

A plurality of second magnetic domain regions d2 may be arranged (e.g., continuously arranged) in series at at least one side surface of the first magnetic domain region d1, and in a length direction of the first magnetic domain region d1. For example, the magnetic track 100 in FIG. 1 includes a plurality of magnetic domain regions arranged continuously. One of the magnetic domain regions constitutes the first magnetic domain region d1, whereas the other magnetic domain regions constitute second magnetic domain regions d2. In FIG. 1, regions other than the first magnetic domain region d1 in the magnetic track 100 are designated with R1. The other regions R1 include second magnetic domain regions d2. Although the second magnetic domain regions d2 are arranged at the both side surfaces of the first magnetic domain region d1 in FIG. 1, the second magnetic domain regions d2 may be arranged at only one side surface of the first magnetic domain region d1. For example, the first magnetic domain region d1 may be arranged at one end of the magnetic track 100. However, the first magnetic domain region d1 may be arranged at various positions.

According to at least some example embodiments, two or more first magnetic domain regions d1 may be formed. If two first magnetic domain regions d1 are formed, one first domain region may be arranged at one end of the magnetic track 100 and the other first magnetic domain region d1 may be arranged at the other (an opposite) end of the magnetic track 100. If three or more first magnetic domain regions d1 are formed, the first magnetic domain regions d1 may be arranged at equal or substantially equal intervals.

A magnetic domain wall region DW may be formed between each pair of neighboring (adjacent) magnetic domain regions. For example, in FIG. 1 a magnetic domain wall region DW is arranged between the first magnetic domain region d1 and each neighboring second magnetic domain regions d2. A magnetic domain wall region DW is also arranged between each pair of neighboring (adjacent) second magnetic domain regions d2. The magnetic domain wall region DW is a region in which a magnetic domain wall is pinned.

In FIG. 1, the magnetic domain wall region DW is illustrated two-dimensionally. But, the magnetic domain wall region DW may be a three-dimensional region having a given, desired, or predetermined volume. For example, the magnetic domain wall region DW may be an impurity-doped region or a region having notches such that the magnetic domain wall region DW is defined by doping impurities or forming a notch. The notches may be formed on both side surfaces of the magnetic track 100. As the magnetic domain wall regions DW are defined, a plurality of magnetic domain regions (e.g., the first and second magnetic domain regions d1 and d2) are defined. Although the magnetic track 100 has the form of a line in FIG. 1, the magnetic track 100 may have various alternative forms.

A first unit 200 may be formed on the first magnetic domain region d1. The length of the first unit 200 may be the same or similar to the length l1 of the first magnetic domain region d1. The first unit 200 may be a device using the tunnel magneto-resistance (TMR) effect (hereinafter referred to as a TMR device), or a device using the giant magneto-resistance (GMR) effect (hereinafter referred to as a GMR device). The first unit 200 may be a write unit, a read unit, or a read/write unit. Although the first unit 200 is formed on a bottom surface of the first magnetic domain region d1 in FIG. 1, the first unit 200 may be located on a top surface of the first magnetic domain region d1 or may be divided and located on top and bottom surfaces of the first magnetic domain region d1. If two or more first magnetic domain regions d1 are formed, a first unit 200 may be formed on each of the first magnetic domain regions d1. The first unit 200 will be described in more detail below.

Still referring to FIG. 1, the information storage device may further include a magnetic domain wall movement unit 300 connected to the magnetic track 100. The magnetic domain wall movement unit 300 may include a power source. The power source may be a current source configured to generate a pulse current. The magnetic domain wall movement unit 300 may further include a switching device, such as a transistor or a diode, between the power source and the magnetic track 100. Although the magnetic domain wall movement unit 300 is connected to one end of the magnetic track 100 in FIG. 1, the magnetic domain wall movement unit 300 may be connected to the other end or both ends of the magnetic track 100. When a pulse current is supplied from the magnetic domain wall movement unit 300 to the magnetic track 100, magnetic domains in magnetic domain regions (e.g., the first and second magnetic domain regions d1 and d2)

and magnetic domain walls in the magnetic domain wall regions DW may move by one bit in a given, desired or predetermined direction.

In a more detailed example, a magnetic domain in an nth magnetic domain region (e.g., the first magnetic domain region d1 or the second magnetic domain region d2) and a magnetic domain wall in an nth the magnetic domain wall region DW may move to an (n+1)th (or (n−1)th) magnetic domain region (the first magnetic domain region d1 or the second magnetic domain region d2) and an (n+1)th (or (n−1)th) magnetic domain wall region DW, respectively, in response to the pulse current. Because a current is conventionally regarded as flowing in a direction opposite to that in which electrons move, the magnetic domain and the magnetic domain wall move in a direction opposite to direction of the current flow.

Each of a plurality of magnetic domain regions may correspond to one bit. Thus, in response to the pulse current, a magnetic domain wall disposed at a first point P1 may move to a second point P2 and a magnetic domain wall disposed at the second point P2 may move to a third point P3. Alternatively, the magnetic domain wall disposed at the second point P2 may move to the first point P1 and the magnetic domain wall disposed at the third point P3 may move to the second point P2. A magnetic domain wall movement speed V1 in the first magnetic domain region d1 may be greater than a magnetic domain wall movement speed V2 in the second magnetic domain region d2. According to at least one example embodiment, the length l1 of the first magnetic domain region d1, the length l2 of the second magnetic domain region d2, the magnetic domain wall movement speed V1 in the first magnetic domain region d1, and the magnetic domain wall movement speed V2 in the second magnetic domain region d2 satisfy Equation (1).

$$V1 = \frac{l1}{l2} \times V2 \qquad (1)$$

In order to achieve such a difference in magnetic domain wall movement speed, the first and second magnetic domain regions d1 and d2 may have different properties and/or sizes (e.g., thicknesses and/or widths), which will be described in more detail later.

Example structures of the first unit 200 will now be described in detail with reference to FIGS. 2 and 3.

Figure 2:
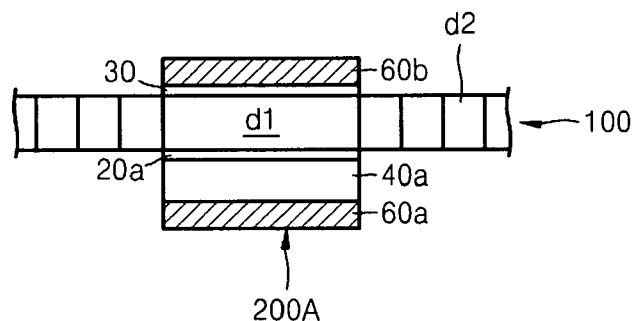
FIGS. 2 and 3 are cross-sectional views of read/write units of information storage devices according to example embodiments.

Referring to the example embodiment of FIG. 2, a first unit 200A includes a first pinning layer 40a formed on a bottom surface of the first magnetic domain region d1. A first isolating layer 20a may be interposed between the first pinning layer 40a and the first magnetic domain region d1. Although the first pinning layer 40a is formed on a bottom surface of the first magnetic domain region d1 in FIG. 2, alternatively the first pinning layer 40a may be formed on an upper surface of the first magnetic domain region d1 in FIG. 2.

The first isolating layer 20a may be an insulating layer or a conductive layer. If the first isolating layer 20a is an insulating layer, the first unit 200A may be a TMR device. If the first isolating layer 20a is a conductive layer, the first unit 200A may be a GMR device.

Still referring to FIG. 2, the first unit 200A further includes a first electrode 60a formed on a bottom surface of the first pinning layer 40a, and a second electrode 60b formed on the first magnetic domain region d1. A resistive layer 30 having an electrical resistance greater than the magnetic track 100 may be formed between the second electrode 60b and the first magnetic domain region d1. The resistive layer 30 may function as an electrical barrier suppressing and/or preventing a current, which is supplied to the magnetic track 100 to move magnetic domains and magnetic domain walls, from leaking to the first unit 200A. The resistive layer 30 may not interrupt the flow of a current supplied between the first and second electrodes 60a and 60b. The resistive layer 30 may be formed to an appropriate thickness by using a material having an appropriate electrical resistance. For example, the specific resistance of the resistive layer 30 may be between about 500 and about 10,000 times (e.g., between about 1,000 and about 3,000 times) greater than the specific resistance of the magnetic track 100. To achieve such a difference in specific resistance, the magnetic track 100 may be formed of one of NiFe, Co, CoNi, CoFe, CoCr, CoCu, NiCu, FePt, FePd, CoCrPt, CoFeTb, CoFeGd, CoTb, and CoFeNi, a combination thereof, or the like, whereas the resistive layer 30 may be formed of one or more materials having a relatively high specific resistance. For example, the resistive layer 30 may be formed of one of CoZrNb and CoFeB, which are amorphous materials, a combination thereof, or a magnetic material containing impurities such as Si and B.

If the first isolating layer 20a is a conductive layer, a layer identical or substantially identical to the resistive layer 30 may be formed between the magnetic track 100 and the first isolating layer 20a.

Although not shown in FIG. 2, at least one layer for pinning a magnetization direction of the first pinning layer 40a may be formed between the first pinning layer 40a and the first electrode 60a. The at least one layer may include an anti-ferromagnetic layer. The structure of a layer (or layers) for pinning the magnetization direction of the first pinning layer 40a is well known in the art, and thus, a detailed description thereof will be omitted.

Figure 3:
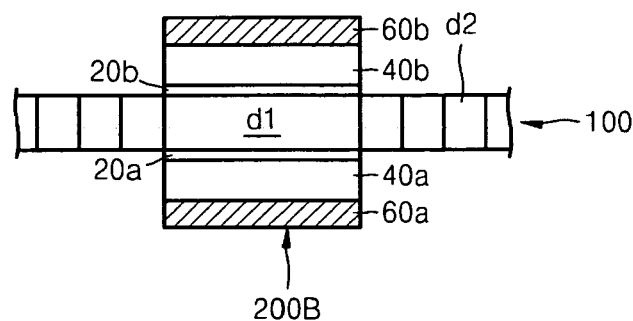

FIG. 3 is a cross-sectional view of another example embodiment of a first unit.

Referring to the example embodiment shown in FIG. 3, the first unit 200B includes a first pinning layer 40a formed on a bottom surface of the first magnetic domain region d1, and a second pinning layer 40b formed on a top surface of the first magnetic domain region d1. The first and second pinning layers 40a and 40b may have opposite magnetization directions. A first isolating layer 20a is formed between the first pinning layer 40a and the first magnetic domain region d1. A second isolating layer 20b is formed between the second pinning layer 40b and the first magnetic domain region d1.

The first and second isolating layers 20a and 20b may be insulating layers or conductive layers. If the first and second isolating layers 20a and 20b are conductive layers, a layer identical or substantially identical to the resistive layer 30 illustrated in FIG. 2 may be formed between the first isolating layer 20a and the first magnetic domain region d1, and between the second isolating layer 20b and the first magnetic domain region d1. A first electrode 60a may be formed on a bottom surface of the first pinning layer 40a. A second electrode 60b may be formed on a top surface of the second pinning layer 40b.

Methods of recording and reproducing information by using the first units 200A and 200B respectively illustrated in FIGS. 2 and 3 will now be briefly described.

Given, desired or predetermined information may be recorded in the first magnetic domain region d1 by supplying a write current to the first unit 200A of FIG. 2 in a given, desired or predetermined direction. The type of information that is to be recorded in the first magnetic domain region d1 may vary according to the direction of the write current.

For example, in FIG. 2 if a first write current is supplied from the second electrode 60b to the first electrode 60a, electrons flow from the first electrode 60a to the second electrode 60b. In this case, only electrons having the same spin direction as the first pinning layer 40a pass through the first pinning layer 40a and provide a spin transfer torque to the first magnetic domain region d1. Electrons having a spin direction opposite to the first pinning layer 40a do not pass through the first pinning layer 40a. Thus, the first magnetic domain region d1 may be magnetized in the same direction as the first pinning layer 40a. In this case, information '0' may be recorded in the first magnetic domain region d1.

In another example, if a second write current is supplied from the first electrode 60a to the second electrode 60b, electrons flow from the second electrode 60b to the first electrode 60a. In this case, a spin transfer torque is provided to the first magnetic domain region d1 because electrons having the same spin direction as the first pinning layer 40a pass through the first pinning layer 40a and flow to the first electrode 60a, whereas electrons having an opposite spin direction to the first pinning layer 40a do not pass through the first pinning layer 40a. Instead, these electrons return back to the first magnetic domain region d1. Thus, the first magnetic domain region d1 may be magnetized in the opposite direction to the first pinning layer 40a. In this case, information '1' may be recorded in the first magnetic domain region d1. As such, information '0' or '1' may be recorded in a magnetic domain of the first magnetic domain region d1 by supplying a given, desired or predetermined write current to the first unit 200A.

If the first unit 200B illustrated in FIG. 3 is used, a recording operation may be performed with a smaller amount of a current when compared to the first unit 200A illustrated in FIG. 2 because a spin transfer torque may be provided from each of the first and second pinning layers 40a and 40b to the first magnetic domain region d1.

A plurality of pieces of information may be recorded in the magnetic track 100 by repeatedly supplying a write current and moving magnetic domain walls of the magnetic track 100 by one bit in a given, desired or predetermined direction.

A reading current may be supplied to the first unit 200A to reproduce information recorded in the first magnetic domain region d1 illustrated in FIG. 2. Because the resistance of the reading current varies according to the type of information recorded in the first magnetic domain region d1, the information recorded in the first magnetic domain region d1 may be determined. The reading current may be supplied between the first and second electrodes 60a and 60b or between the first electrode 60a and an end of the magnetic track 100. Although the reading current may be supplied between the first electrode 60a and the end of the magnetic track 100, magnetization states of all magnetic domain regions other than the first magnetic domain region d1 (e.g., the second magnetic domain regions d2) may not greatly influence the reading current. Rather, the magnetization state of the first magnetic domain region d1 on which the first unit 200A is formed dominantly influences the amount of the reading current. In the case of the first unit 200B illustrated in FIG. 3, the reading current may be supplied between one of the first and second electrodes 60a and 60b and an end of the magnetic track 100.

A plurality of pieces of information may be reproduced from the magnetic track 100 by repeatedly reading information of the first magnetic domain region d1 by supplying a reading current and moving magnetic domain walls of the magnetic track 100 by one bit in a given, desired or predetermined direction.

As described above, when the magnetic domain walls of the magnetic track 100 are moved in a given, desired or predetermined direction, a magnetic domain wall movement speed in the first magnetic domain region d1 may be greater than the magnetic domain wall movement speed in the second magnetic domain region d2. Referring back to FIG. 1 for example, while a magnetic domain wall disposed at the first point P1 is moved to the second point P2, a magnetic domain wall disposed at the second point P2 is moved to the third point P3.

In FIG. 1, the difference in magnetic domain wall movement speed may result from, for example, different properties and/or sizes of the first magnetic domain region d1 and the second magnetic domain regions d2 (e.g., the other regions R1). In more detail, for example, if a spin polarization Sp, a saturation magnetization Ms and/or a magnetic anisotropy energy constant Ku of the first magnetic domain region d1 is different from that of the second magnetic domain region d2, the first and second magnetic domain regions d1 and d2 may have different magnetic domain wall movement speeds. Also, if a thickness and/or a width of the first magnetic domain region d1 is different from that of the second magnetic domain region d2, the first and second magnetic domain regions d1 and d2 may have different magnetic domain wall movement speeds. The principle that the first and second magnetic domain regions d1 and d2 have different magnetic domain wall movement speeds will now be described with reference to FIGS. 4 through 8.

Figure 4:
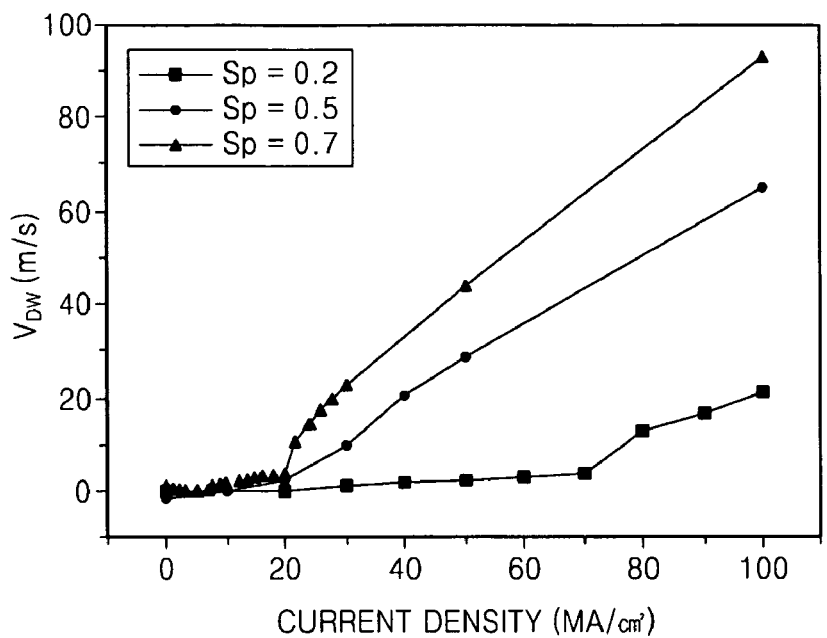
FIG. 4 is a graph illustrating variations in magnetic domain wall movement speed according to density of a current supplied to three magnetic track samples having different spin polarizations.

FIG. 4 is a graph illustrating variations in a magnetic domain wall movement speed $V_{DW}$ according to density of a current supplied to three magnetic track samples having different spin polarizations Sps. FIG. 4 will be described in conjunction with FIG. 1.

Referring to FIG. 4, the magnetic domain wall movement speed $V_{DW}$ increases as a spin polarization Sp increases. Thus, when the structure illustrated in FIG. 1 is formed, the magnetic domain wall movement speed $V_{DW}$ in the first magnetic domain region d1 may be increased by selectively increasing the spin polarization Sp of the first magnetic domain region d1. An example of a method for increasing a spin polarization Sp is a gaseous adsorption method. In more detail, a given, desired or predetermined gas phase may be absorbed only in the first magnetic domain region d1 by exposing only the first magnetic domain region d1 to the gas phase. As a result, the spin polarization Sp of the first magnetic domain region d1 may be increased. Alternatively, a difference in the spin polarization Sp between the first magnetic domain region d1 and the other regions R1 may be caused by using other methods.

Figure 5:
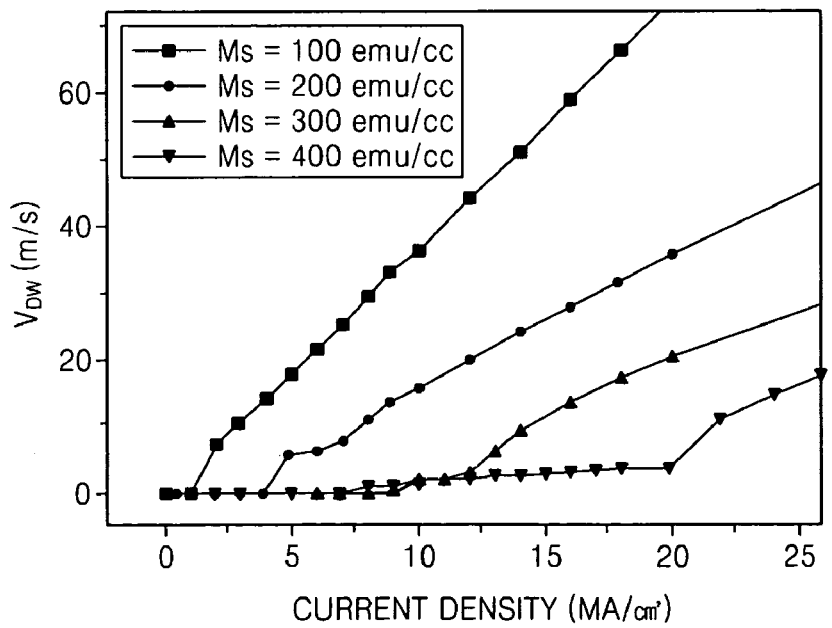
FIG. 5 is a graph illustrating variations in magnetic domain wall movement speed according to density of a current supplied to three magnetic track samples having different saturation magnetizations.

FIG. 5 is a graph illustrating variations in a magnetic domain wall movement speed $V_{DW}$ according to density of a current supplied to three magnetic track samples having different saturation magnetizations Ms. FIG. 5 will be described in conjunction with FIG. 1.

Referring to FIG. 5, the magnetic domain wall movement speed $V_{DW}$ increases as a saturation magnetization Ms decreases. Thus, when forming the structure illustrated in FIG. 1, the magnetic domain wall movement speed $V_{DW}$ in the first magnetic domain region d1 may be increased by making the saturation magnetization Ms of the first magnetic domain region d1 lower than that of the second magnetic domain regions d2. For example, if a soft magnetic layer is attached to a surface of the first magnetic domain region d1, the saturation magnetization Ms of the first magnetic domain region d1 may be decreased due to the soft magnetic layer. In FIG. 2, for example, the soft magnetic layer may be interposed between the first magnetic domain region d1 and the first isolating layer 20a and/or between the first magnetic domain region d1 and the resistive layer 30. In FIG. 3, the soft magnetic layer may be interposed between the first magnetic domain region d1 and the first isolating layer 20a and/or between the first magnetic domain region d1 and the second isolating layer 20b. Instead of and/or together with the method using the soft magnetic layer, other methods may also be used. For example, a difference in the saturation magnetization Ms may be caused by forming the first magnetic domain region d1 of a first material having a relatively low saturation magnetization Ms and forming the second magnetic domain regions d2 of a second material having a relatively high saturation magnetization Ms.

Figure 6:
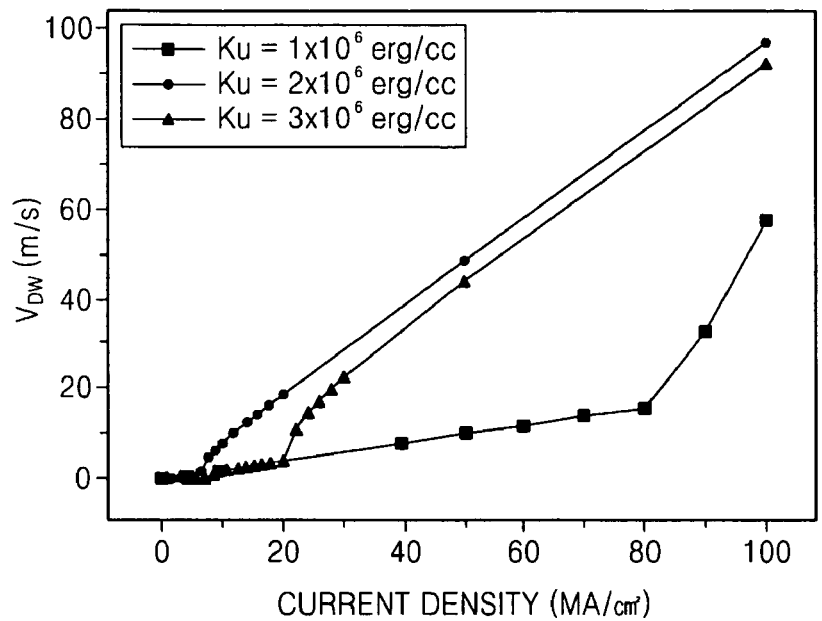
FIG. 6 is a graph illustrating variations in magnetic domain wall movement speed according to density of a current supplied to three magnetic track samples having different magnetic anisotropy energy constants.

FIG. 6 is a graph illustrating variations in a magnetic domain wall movement speed $V_{DW}$ according to density of a current supplied to three magnetic track samples having different magnetic anisotropy energy constants Ku. FIG. 6 will be described in conjunction with FIG. 1.

Referring to FIG. 6, the magnetic domain wall movement speed $V_{DW}$ increases and then decreases as a magnetic anisotropy energy constant Ku increases. In more detail, the magnetic domain wall movement speed $V_{DW}$ in a magnetic track sample of which the magnetic anisotropy energy constant Ku is about $2 \times 10^6$ erg/cc is greater than that in a magnetic track sample of which the magnetic anisotropy energy constant Ku is about $1 \times 10^6$ erg/cc. However, the magnetic domain wall movement speed $V_{DW}$ in a magnetic track sample of which the magnetic anisotropy energy constant Ku is about $3 \times 10^6$ erg/cc is only slightly less than that of the magnetic track sample of which the magnetic anisotropy energy constant Ku is about $2 \times 10^6$ erg/cc. Based on this, the magnetic domain wall movement speed $V_{DW}$ may increase until the magnetic anisotropy energy constant Ku increases to a given, desired or predetermined critical value, but may decrease only slightly when the magnetic anisotropy energy constant Ku is greater than the critical value. The magnetic anisotropy energy constant Ku is a material constant related to crystallinity of the magnetic track 100. For example, as the crystallinity of the magnetic track 100 improves (e.g., is relatively good or excellent), the magnetic anisotropy energy constant Ku increases. Thus, when the structure illustrated in FIG. 1 is formed, the magnetic anisotropy energy constant Ku of the first magnetic domain region d1 may be differed from that of the second magnetic domain region d2 by making the crystallinity of the first magnetic domain region d1 different from the crystallinity of the second magnetic domain regions d2 (e.g., the other regions R1 in FIG. 1). Accordingly, the magnetic domain wall movement speed $V_{DW}$ in the first magnetic domain region d1 may be different from that in the second magnetic domain region d2.

For example, if impurity ions such as helium (He) ions or gallium (Ga) ions are injected into a given, desired or predetermined region of the magnetic track 100, the magnetic anisotropy energy constant Ku of the given, desired or predetermined region may be selectively decreased. Here, the given, desired or predetermined region may be the first magnetic domain region d1 or the second magnetic domain regions d2. In addition to doping impurity ions, other methods may also be used. For example, the crystallinity of the first magnetic domain region d1 may be differed from that of the second magnetic domain regions d2 by forming the first and second magnetic domain regions d1 and d2 on base layers having different crystallinity characteristics because the crystallinity of a magnetic layer formed on a base layer may vary according to the crystallinity of the base layer.

Figure 7:
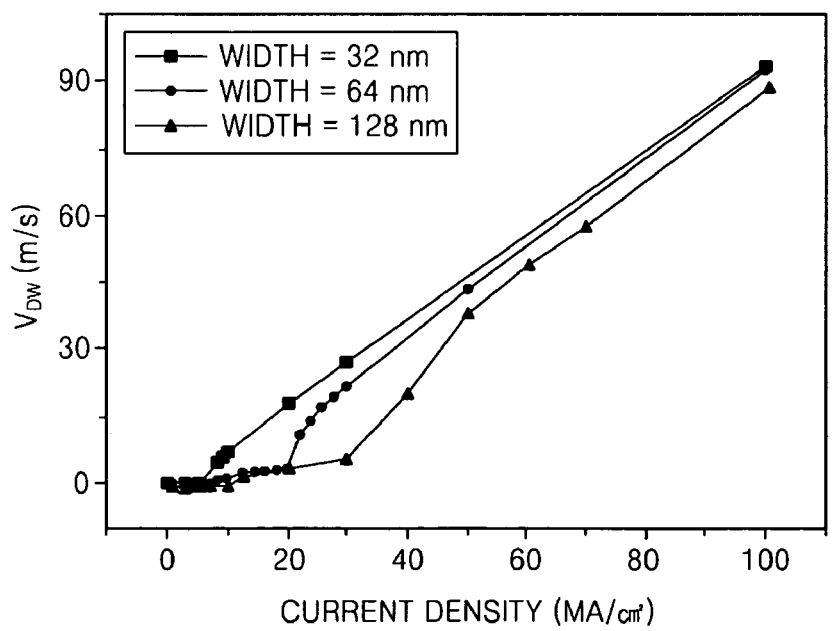
FIG. 7 is a graph illustrating variations in magnetic domain wall movement speed according to density of a current supplied to three magnetic track samples having different widths.

FIG. 7 is a graph illustrating variations in a magnetic domain wall movement speed $V_{DW}$ according to density of a current supplied to three magnetic track samples having different widths. FIG. 7 will be described in conjunction with FIG. 1.

Referring to FIG. 7, the magnetic domain wall movement speed $V_{DW}$ increases as a width of a magnetic track sample decreases. The width of the magnetic track sample is inversely proportional to the density of the supplied current. Thus, in the magnetic track 100, if a width (e.g., a length in the Y-axis direction) of the first magnetic domain region d1 is about 32 nm, the width of the second magnetic domain regions d2 is about 64 nm, and a current of about 60 MA/cm² flows in the first magnetic domain region d1, then a current of about 30 MA/cm² flows in the second magnetic domain regions d2. As shown in FIG. 7, if the current of about 60 MA/cm² flows in a magnetic track sample having the width of about 32 nm, a magnetic domain wall moves at a speed of about 55.6 m/s. If the current of about 30 MA/cm² flows in a magnetic track sample having a width of about 64 nm, a magnetic domain wall moves at a speed of about 22.4 m/s. Thus, if the width of the first magnetic domain region d1 is about 32 nm, the width of the second magnetic domain regions d2 is about 64 nm, and current of about 60 MA/cm² flows in the first magnetic domain region d1, then the magnetic domain wall movement speed $V_{DW}$ in the first magnetic domain region d1 (about 55.6 m/s) is about 2.5 times greater than the magnetic domain wall movement speed $V_{DW}$ in the second magnetic domain region d2 (about 22.4 m/s).

Figure 8:
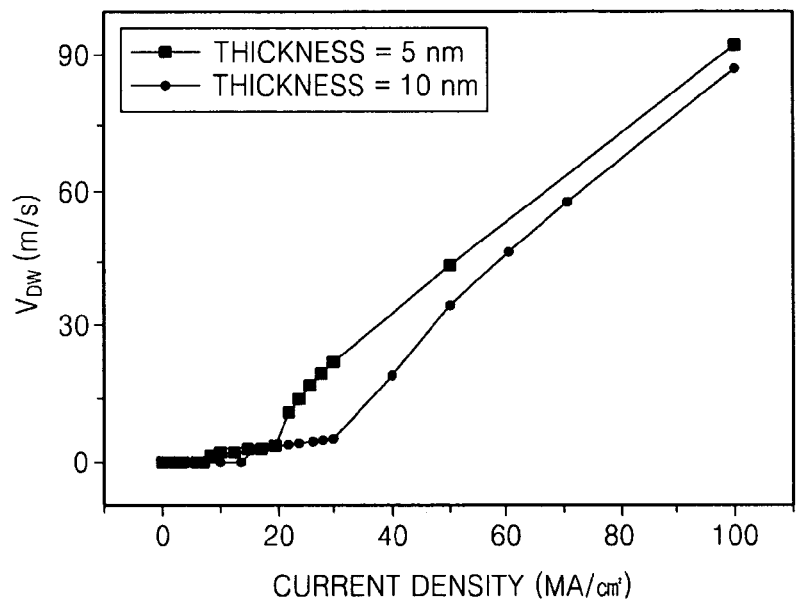
FIG. 8 is a graph illustrating variations in magnetic domain wall movement speed according to density of a current supplied to two magnetic track samples having different thicknesses.

FIG. 8 is a graph illustrating variations in a magnetic domain wall movement speed $V_{DW}$ according to density of a current supplied to two magnetic track samples having different thicknesses. FIG. 8 will be described in conjunction with FIG. 1.

Referring to FIG. 8, the magnetic domain wall movement speed $V_{DW}$ increases as a thickness of a magnetic track sample decreases. The thickness of the magnetic track sample is inversely proportional to the density of the supplied current. Thus, in the magnetic track 100, if a thickness of the first magnetic domain region d1 is about 5 nm, the thickness of the second magnetic domain regions d2 is about 10 nm, and a current of about 60 MA/cm² flows in the first magnetic domain region d1, then a current of about 30 MA/cm² flows in the second magnetic domain regions d2. As shown in FIG. 8, if the current of about 60 MA/cm² flows in a magnetic track sample having the thickness of about 5 nm, a magnetic domain wall moves at a speed of about 53.5 m/s. If the current of about 30 MA/cm² flows in a magnetic track sample having a thickness of about 10 nm, a magnetic domain wall moves at a speed of about 5.5 m/s. Thus, if the thickness of the first magnetic domain region d1 is about 5 nm, the thickness of the second magnetic domain regions d2 is about 10 nm, and the current of about 60 MA/cm² flows in the first magnetic domain region d1, then the magnetic domain wall movement speed $V_{DW}$ in the first magnetic domain region d1 (about 53.5 m/s) may be about 10 times greater than the magnetic domain wall movement speed $V_{DW}$ in the second magnetic domain region d2 (about 5.5 m/s).

Table 1 shows example variations in magnetic domain wall movement speed according to material constants and sizes (width and thickness) of a magnetic track based on the graphs of FIGS. 4 through 8.

TABLE 1

|  | Condition 1 | Condition 2 | Magnetic Domain Wall Movement Speed Ratio (Condition1/Condition2) |
|---|---|---|---|
| Spin Polarization Sp | 0.7 | 0.5 | 1.52 |
| Saturation Magnetization Ms (emu/cc) | 100 | 200 | 2.13 |
| Anisotropy Energy Constant Ku (Merg/cc) | 2 | 3 | 1.11 |
| Width (nm) | 32 | 64 | 2.49 |
| Thickness (nm) | 5 | 10 | 9.73 |

Referring to Table 1, a variation in magnetic domain wall movement speed when the width and/or the thickness of the magnetic track are changed (e.g., when the thickness of the magnetic track is changed) is greater than when the material constants vary.

In the example embodiment shown in FIG. 1, a magnetic domain wall may be moved at a relatively high speed in the first magnetic domain region d1 of the magnetic track 100, by making at least one of a spin polarization Sp, a saturation magnetization Ms, a magnetic anisotropy energy constant Ku, a width, and a thickness of the first magnetic domain region d1 different from that of the other regions R1. Thus, the magnetic track 100 satisfying Equation (1), and the information storage device including the magnetic track 100 may be realized.

As such, according to the above example embodiments, the magnetic track 100, in which magnetic domain regions have different magnetic domain wall movement speeds according to lengths of the magnetic domain regions, may be realized. Also, if the magnetic track 100 is applied to the information storage device, only the first magnetic domain region d1 on which the first unit 200 is formed may be selectively formed to be relatively large and the other regions R1 (the second magnetic domain regions d2) may be formed to be relatively small. For example, regardless of the size of the first unit 200, the other regions R1 may be formed as small as possible, thereby increasing a recording density. Also, because the first unit 200 need not be formed as small as the other regions R1, the first unit 200 may be formed more easily.

Figure 9A:
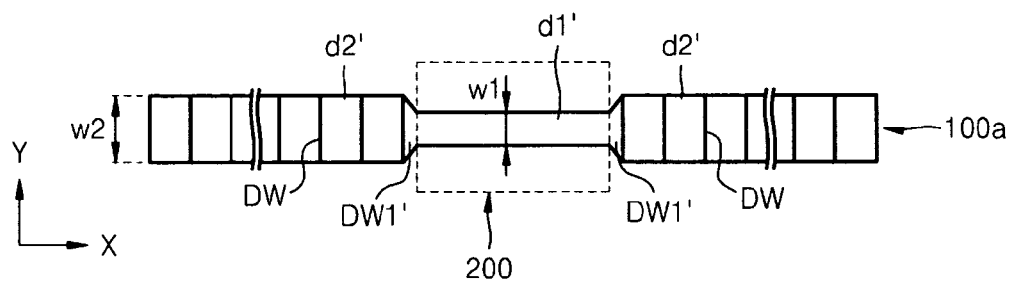
FIGS. 9A and 9B are plan views of information storage devices including magnetic tracks according to other example embodiments.
Figure 9B:
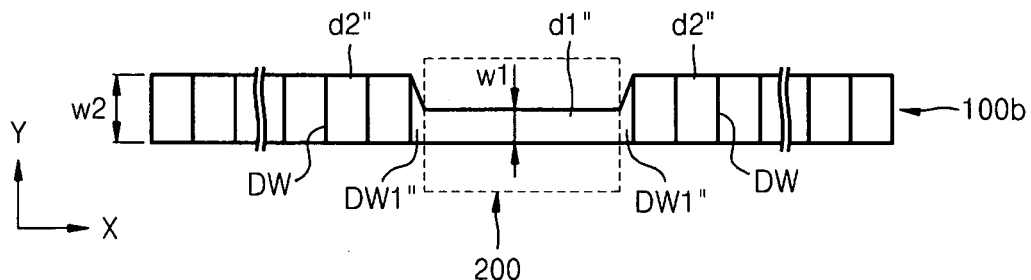

FIG. 9A is a plan view of an information storage device including a magnetic track according to another example embodiment. FIG. 9B is a plan view of an information storage device including a magnetic track according to another example embodiment.

In FIGS. 9A and 9B, the first magnetic domain region d1 and the other regions R1 illustrated in FIG. 1 have different widths.

Referring to FIG. 9A, a first magnetic domain region d1' of the magnetic track 100a has a relatively small first width w1, whereas the other magnetic domain regions (e.g., second magnetic domain regions d2') has a larger second width w2. The first magnetic domain region d1' may be a region on which a first unit 200 is formed. Connection regions DW1' serve as magnetic domain wall regions and may be formed between the first magnetic domain region d1' and a neighboring second magnetic domain regions d2'. As shown in FIG. 9A, for example, the widths of the connection regions DW1' taper from neighboring second magnetic domain regions d2' to the first magnetic domain region d1'. Although a magnetic domain wall region DW between two neighboring second magnetic domain regions d2' is illustrated two-dimensionally in FIG. 9A, the magnetic domain wall region DW may substantially be a three-dimensional region having a given, desired or predetermined volume. In FIG. 9A, the center of the first magnetic domain region d1' and the centers of the second magnetic domain regions d2' may be disposed on the same straight line or axis. Alternatively, however, relative positions of the first and second magnetic domain regions d1' and d2' may vary as illustrated in FIG. 9B.

Referring to FIG. 9B, a first magnetic domain region d1" is disposed at a lower position (a direction opposite to the Y-axis direction) of the drawing than the first magnetic domain region d1' illustrated in FIG. 9A. In this example, a side surface of the magnetic track 100b is even. In FIG. 9B, similar to the connection region DW1' illustrated in FIG. 9A, widths of connection regions DW1" between the first magnetic domain region d1" and neighboring second magnetic domain regions d2" taper from the neighboring second magnetic domain regions d2" to the first magnetic domain region d1".

Figure 10A:
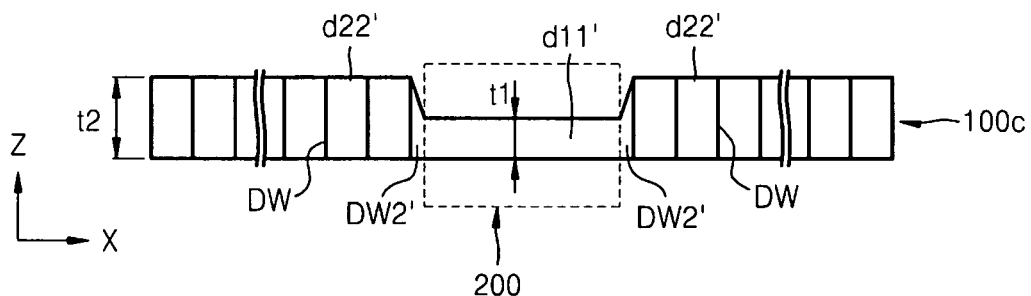
FIGS. 10A and 10B are cross-sectional views of information storage devices including magnetic tracks according to other example embodiments.
Figure 10B:
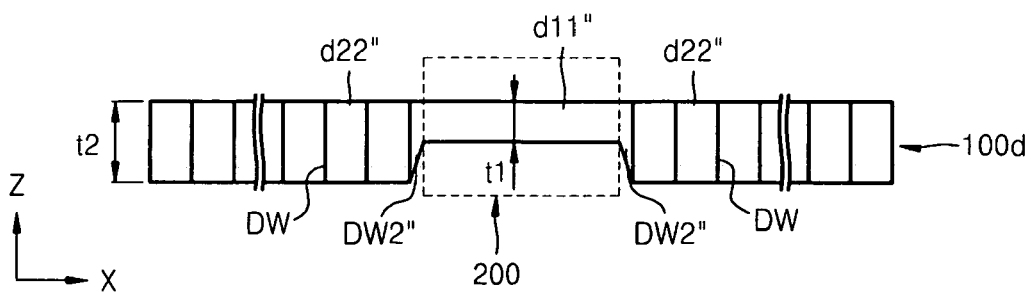

FIG. 10A is a cross-sectional view of an information storage device including a magnetic track according to another example embodiment. FIG. 10B is a cross-sectional view of an information storage device including a magnetic track according to another example embodiment. In FIGS. 10A and 10B, the first magnetic domain region d1 and the other regions R1 illustrated in FIG. 1 have different thicknesses.

Referring to FIG. 10A, a first magnetic domain region d11' of the magnetic track 100c has a relatively small first thickness t1, whereas the other magnetic domain regions (e.g., second magnetic domain regions d22') have a larger second thickness t2. The first magnetic domain region d11' may be a region on which a first unit 200 is formed. Connection regions DW2' may serve as magnetic domain wall regions, and may be formed between the first magnetic domain region d11' and a neighboring second magnetic domain region d22'. As shown in FIG. 10A, the thicknesses of the connection regions DW2' taper from the neighboring second magnetic domain regions d22' to the first magnetic domain region d11'. In FIG. 10A, although a bottom surface of the magnetic track 100c is even or planar, and the first magnetic domain region d11' has a relatively small thickness because a groove is formed in a top surface of the magnetic track 100c, this structure may be modified in various ways, for example, as illustrated in FIG. 10B.

The structure illustrated in FIG. 10B is similar to a structure obtained by turning the structure illustrated in FIG. 10A upside down. Referring to FIG. 10B, a first magnetic domain region d11" is disposed at an upper position of the drawing. In this example, a top surface of the magnetic track 100d is even or planar. In FIG. 10B, similar to the connection region DW2' illustrated in FIG. 10A, thicknesses of connection regions DW2" between the first magnetic domain region d11" and neighboring second magnetic domain regions d22" taper from the neighboring second magnetic domain region d22" to the first magnetic domain region d11".

In FIGS. 9A, 9B, 10A, and 10B, reference numeral 200 represents a first unit formed on the first magnetic domain region d1', d1", d11', or d11". In at least one example embodiment, a portion of the first unit 200 may be formed, the magnetic track 100a, 100b, 100c, or 100d may be formed on the portion of the first unit 200, and then the other portion of the first unit 200 may be formed on the magnetic track 100a, 100b, 100c, or 100d. The connection regions DW1', DW1", DW2', or DW2" may be optionally formed. Although not shown in FIGS. 9A, 9B, 10A, and 10B, a unit identical or substantially identical to the magnetic domain wall movement unit 300 may be connected to each of the magnetic tracks 100a, 100b, 100c, and 100d.

It should be understood that the example embodiments described therein should be considered in a descriptive sense only and not for purposes of limitation. For example, it will be understood by one of ordinary skill in the art that the structures illustrated in FIGS. 1, 2, 3, 9A, 9B, 10A, and 10B may be constructed in various ways, and that, in FIGS. 1, 2, 3, 9A, 9B, 10A, and 10B the magnetic tracks 100, 100a, 100b, 100c, and 100d and the first and second pinning layers 40a and 40b may have vertical or horizontal magnetic anisotropy. Thus, descriptions of features or aspects within each example embodiment should typically be considered as available for other similar features or aspects in other example embodiments.

What is claimed is:

1. A magnetic track comprising:
   a first magnetic domain region; and
   at least one second magnetic domain region, the at least one second magnetic domain region having a different length from the first magnetic domain region; wherein
   a magnetic domain wall movement speed in the first magnetic domain region is different from a magnetic domain wall movement speed in the second magnetic domain region.

2. The magnetic track of claim 1, wherein a length of the first magnetic domain region is greater than a length of the second magnetic domain region.

3. The magnetic track of claim 1, wherein the magnetic domain wall movement speed in the first magnetic domain region is greater than the magnetic domain wall movement speed in the second magnetic domain region.

4. The magnetic track of claim 1, wherein $V1=(l1/l2) \times V2$ is satisfied, and wherein l1 is a length of the first magnetic domain region, l2 is a length of the second magnetic domain region, V1 is the magnetic domain wall movement speed in the first magnetic domain region, and V2 is the magnetic domain wall movement speed in the second magnetic domain region.

5. The magnetic track of claim 1, wherein properties of the first magnetic domain region are different from the properties of the second magnetic domain region.

6. The magnetic track of claim 5, wherein at least one of a width and a thickness of the first magnetic domain region is different from that of the second magnetic domain region.

7. The magnetic track of claim 5, wherein at least one of a spin polarization, a saturation magnetization, and a magnetic anisotropy energy constant of the first magnetic domain region is different from that of the second magnetic domain region.

8. The magnetic track of claim 1, wherein at least one of a width and a thickness of the first magnetic domain region is different from that of the second magnetic domain region.

9. The magnetic track of claim 1, wherein a plurality of second magnetic domain regions are connected in series to at least one end of the first magnetic domain region.

10. A magnetic track comprising:
    a plurality of magnetic domain regions, the plurality of magnetic domain regions including a first magnetic domain region and at least one second magnetic domain region having a smaller length than the first magnetic domain region and a magnetic domain wall region formed between each pair of neighboring magnetic domain regions; wherein
    the first magnetic domain region is an information read/write region to read and write information.

11. The magnetic track of claim 10, wherein a magnetic domain wall movement speed in the first magnetic domain region is greater than a magnetic domain wall movement speed in the second magnetic domain region.

12. A magnetic track comprising:
    a plurality of magnetic domain regions, the plurality of magnetic domain regions including a first magnetic domain region and at least one second magnetic domain region having a smaller length than the first magnetic domain region and a magnetic domain wall region formed between each pair of neighboring magnetic domain regions; wherein
    the first magnetic domain region is an information read/write region, and
    $V1=(l1/l2) \times V2$ is satisfied, and wherein l1 is a length of the first magnetic domain region, l2 is a length of the second magnetic domain region, V1 is the magnetic domain wall movement speed in the first magnetic domain region, and V2 is the magnetic domain wall movement speed in the second magnetic domain region.

13. An information storage device comprising:
    a magnetic track including,
        a plurality of magnetic domain regions, the plurality of magnetic domain regions including a first magnetic domain region and at least one second magnetic domain region having a smaller length than the first magnetic domain region, and
        a magnetic domain wall region formed between each pair of neighboring magnetic domain regions, wherein the first magnetic domain region is an information read/write region;
    a first unit configured to perform at least one of an information recording operation and an information reproducing operation on the first magnetic domain region; and
    a magnetic domain wall movement unit configured to move a magnetic domain wall of the magnetic domain wall region.

14. The information storage device of claim 13, wherein a magnetic domain wall movement speed in the first magnetic domain region is greater than a magnetic domain wall movement speed in the second magnetic domain region.

15. The information storage device of claim 14, wherein $V1=(l1/l2) \times V2$ is satisfied, and wherein l1 is a length of the first magnetic domain region, l2 is a length of the second magnetic domain region, V1 is the magnetic domain wall movement speed in the first magnetic domain region, and V2 is the magnetic domain wall movement speed in the second magnetic domain region.

16. The information storage device of claim 14, wherein properties of the first magnetic domain region are different from properties of the second magnetic domain region.

17. The information storage device of claim 16, wherein at least one of a width and a thickness of the first magnetic domain region is different from that of the second magnetic domain region.

18. The information storage device of claim 16, wherein at least one of a spin polarization, a saturation magnetization, and a magnetic anisotropy energy constant of the first magnetic domain region is different from that of the second magnetic domain region.

19. The information storage device of claim 18, wherein the spin polarization of the first magnetic domain region is greater than the spin polarization of the second magnetic domain region.

20. The information storage device of claim 18, wherein the saturation magnetization of the first magnetic domain region is smaller than the saturation magnetization of the second magnetic domain region.

21. The information storage device of claim 14, wherein at least one of a width and a thickness of the first magnetic domain region is different from that of the second magnetic domain region.

22. The information storage device of claim 21, wherein the width of the first magnetic domain region is smaller than the width of the second magnetic domain region.

23. The information storage device of claim 21, wherein the thickness of the first magnetic domain region is smaller than the thickness of the second magnetic domain region.

24. The information storage device of claim 13, wherein a plurality of second magnetic domain regions are connected in series to at least one end of the first magnetic domain region.

25. The information storage device of claim 13, wherein the first unit is one of a tunnel magneto-resistance (TMR) device and a giant magneto-resistance (GMR) device.

* * * * *